US007747027B2

(12) United States Patent
Asada

(10) Patent No.: US 7,747,027 B2
(45) Date of Patent: Jun. 29, 2010

(54) METHOD OF GENERATING TEST TONE SIGNAL AND TEST-TONE-SIGNAL GENERATING CIRCUIT

(75) Inventor: Kohei Asada, Kanagawa (JP)

(73) Assignee: Sony Corporation (JP)

( * ) Notice: Subject to any disclaimer, the term of this patent is extended or adjusted under 35 U.S.C. 154(b) by 1106 days.

(21) Appl. No.: 11/406,691

(22) Filed: Apr. 19, 2006

(65) Prior Publication Data

US 2006/0259169 A1 Nov. 16, 2006

(30) Foreign Application Priority Data

Apr. 20, 2005 (JP) ............................ 2005-121941

(51) Int. Cl.
*H03G 5/00* (2006.01)
*H04M 3/00* (2006.01)

(52) U.S. Cl. ........................ 381/101; 381/61; 333/28 T

(58) Field of Classification Search .................. 381/56, 381/58, 59, 61, 63, 98, 99, 101, 103; 333/28 T; 455/267; 379/418; 84/622, 659, 692
See application file for complete search history.

(56) References Cited

U.S. PATENT DOCUMENTS

| | | | | |
|---|---|---|---|---|
| 4,215,614 | A | 8/1980 | Chibana | |
| 6,134,330 | A * | 10/2000 | De Poortere et al. | 381/61 |
| 6,751,323 | B2 * | 6/2004 | Poldy | 381/101 |
| 6,798,830 | B1 * | 9/2004 | Tharakan | 375/224 |
| 6,856,796 | B2 * | 2/2005 | Ding et al. | 455/295 |
| 7,394,908 | B2 * | 7/2008 | Katou et al. | 381/98 |
| 7,550,977 | B2 * | 6/2009 | Quan | 324/622 |
| 2001/0038702 | A1 | 11/2001 | Lavoie et al. | |
| 2005/0058305 | A1 * | 3/2005 | Yamaki | 381/101 |
| 2008/0031480 | A1 * | 2/2008 | Barthel et al. | 381/316 |

FOREIGN PATENT DOCUMENTS

| | | |
|---|---|---|
| EP | 1180896 | 2/2002 |
| EP | 1578170 | 9/2005 |
| GB | 2239140 | 6/1991 |
| JP | 2001346299 A | 12/2001 |

OTHER PUBLICATIONS

European Search Report, EP 06 25 2048, Apr. 9, 2008.

* cited by examiner

*Primary Examiner*—Xu Mei
(74) *Attorney, Agent, or Firm*—Lerner, David, Littenberg, Krumholz & Mentlik, LLP

(57) ABSTRACT

A method of generating a test tone signal includes generating a fundamental tone signal, which is a sinusoidal signal having a predetermined frequency; generating a first group of harmonic tone signals having different frequencies that are integral multiples of the predetermined frequency; generating a second group of the harmonic tone signals having different frequencies that are integral multiples of the predetermined frequency, at least part of the second group of the harmonic tone signals having frequencies different from frequencies of the first group of the harmonic tone signals; adding the fundamental tone signal to the first group of the harmonic tone signals to generate a first test tone signal; adding the fundamental tone signal to the second group of the harmonic tone signals to generate a second test tone signal; and outputting the first and second test tone signals at predetermined intervals.

5 Claims, 11 Drawing Sheets

FIG. 2

| m | fm [Hz] | PITCH NAME (FREQUENCY OF EQUAL TEMPERAMENT) [Hz] |
|---|---|---|
| 18 | 210. 938 | |
| 19 | 222. 656 | A (222. 656) |
| 20 | 234. 375 | A# (235. 896) |
| 21 | 246. 094 | B (249. 923) |
| 22 | 257. 813 | |
| 23 | 269. 531 | |
| 24 | 281. 250 | C# (280. 529) |
| 25 | 292. 969 | |
| 26 | 304. 688 | |
| 27 | 316. 406 | D# (314. 883) |
| 28 | 328. 125 | |
| 29 | 339. 844 | |
| 30 | 351. 563 | F (353. 445) |
| 31 | 363. 281 | |
| 32 | 375. 000 | F# (374. 462) |
| 33 | 386. 719 | |
| 34 | 398. 438 | G (396. 728) |
| 35 | 410. 156 | |
| 36 | 421. 875 | G# (420. 319) |
| 37 | 433. 594 | |

FIG. 3

| PITCH NAME | m | k | p | | | | |
|---|---|---|---|---|---|---|---|
| A | 19 | | | | | | |
| A# | 20 | 1 | 2 | 4 | 11 | 20 | 33 |
| | | 2 | 2 | 5 | 10 | 17 | 34 |
| | | 3 | 2 | 7 | 8 | 19 | 32 |
| B | 21 | | | | | | |
| C# | 24 | 1 | 2 | 4 | 13 | 16 | 35 |
| | | 2 | 2 | 7 | 8 | 19 | 32 |
| D# | 27 | 1 | 2 | 5 | 10 | 17 | 34 |
| | | 2 | 2 | 4 | 13 | 16 | 35 |
| F | 30 | 1 | 2 | 5 | 10 | 17 | 34 |
| | | 2 | 2 | 4 | 13 | 16 | 35 |
| F# | 32 | 1 | 2 | 4 | 13 | 16 | 35 |
| G | 34 | 1 | 2 | 7 | 8 | 19 | 32 |
| G# | 36 | 1 | 2 | 4 | 11 | 20 | 33 |
| | | 2 | 2 | 5 | 10 | 17 | 34 |
| | | 3 | 2 | 7 | 8 | 19 | 32 |

FIG. 5A STT

FIG. 5B STT (OUTPUT)

FIG. 5C STT (SOUND PICKUP)

FIG. 5D ANALYSIS

METHOD OF GENERATING TEST TONE SIGNAL AND TEST-TONE-SIGNAL GENERATING CIRCUIT

CROSS-REFERENCE TO RELATED APPLICATIONS

The present application claims priority from Japanese Patent Application No. JP 2005-121941 filed on Apr. 20, 2005, the disclosure of which is hereby incorporated by reference herein.

BACKGROUND OF THE INVENTION

The present invention relates to a method of generating a test tone signal and a test-tone-signal generating circuit.

In audio reproduction, audio reproduction systems have been evolving from 2-channel stereo systems into 5.1-channel audio, 7.1-channel audio, and more-than-7.1-channel audio systems as digital audio technologies and audio visual (AV) devices have been developed. However, in such multi-channel audio systems, it becomes difficult for a user to appropriately and manually set the sound balance between channels, frequency characteristics, and others.

In this situation, sound field correction devices that automatically set the sound balance, the frequency characteristics, and others have been supposed. The sound field correction devices supply a test tone signal to the speakers of multiple channels, pick up reproduced sounds from the speakers with microphones, and correct the characteristics of the channels so that the sound balance, the frequency characteristics, and others of the reproduced sounds are appropriately set.

However, in order to perform the sound field correction, it is necessary to first check connection of the speakers. This is because the user fails to obtain information used for the sound field correction in a state in which the speakers are not connected to the apparatus even if the test tone signal is output.

In addition, for example, a reproduction apparatus capable of reproducing 7.1-channel audio signals is possibly used as a reproduction apparatus for 5.1-channel audio signals because of the arrangement of the speakers or the like. Accordingly, it is necessary to check the presence of non-connected speakers (channels that are not used) in multi-channel reproduction apparatuses.

Related arts are disclosed in, for example, Japanese Unexamined Patent Application Publication No. 2001-346299.

In the above setting or checking, a pink noise is generally used as the test tone signal. However, the pink noise is not ear-pleasing because the pink noise strikes the user's ear as noise burst. Furthermore, it is not acceptable that such a pink noise is output from a speaker each time a reproducing apparatus is used (is turned on).

It is desirable not to cause discomfort to a listener (user) in the checking of connection of speakers and to correctly check whether the speakers are connected.

SUMMARY OF THE INVENTION

According to an embodiment of the present invention, a method of generating a test tone signal includes the steps of generating a fundamental tone signal, which is a sinusoidal signal having a predetermined frequency; generating a first group of harmonic tone signals having different frequencies that are integral multiples of the predetermined frequency; generating a second group of the harmonic tone signals having different frequencies that are integral multiples of the predetermined frequency, at least part of the second group of the harmonic tone signals having frequencies different from those of the first group of the harmonic tone signals; adding the fundamental tone signal to the first group of the harmonic tone signals to generate a first test tone signal; adding the fundamental tone signal to the second group of the harmonic tone signals to generate a second test tone signal; outputting the first and second test tone signals at predetermined intervals.

According to the present invention, since the test tone composes a melody in the checking of whether the speakers are connected, the test tone does not make a listener uncomfortable. In addition, since the test tone includes the multiple harmonic tones, it is possible to correctly check whether the speakers are connected.

BRIEF DESCRIPTION OF THE DRAWINGS

FIG. 2 is a table illustrating the embodiments of the present invention;

FIG. 3 is a table illustrating the embodiments of present invention;

DETAILED DESCRIPTION

Sinusoidal Signal

Figures 1A, 1B:
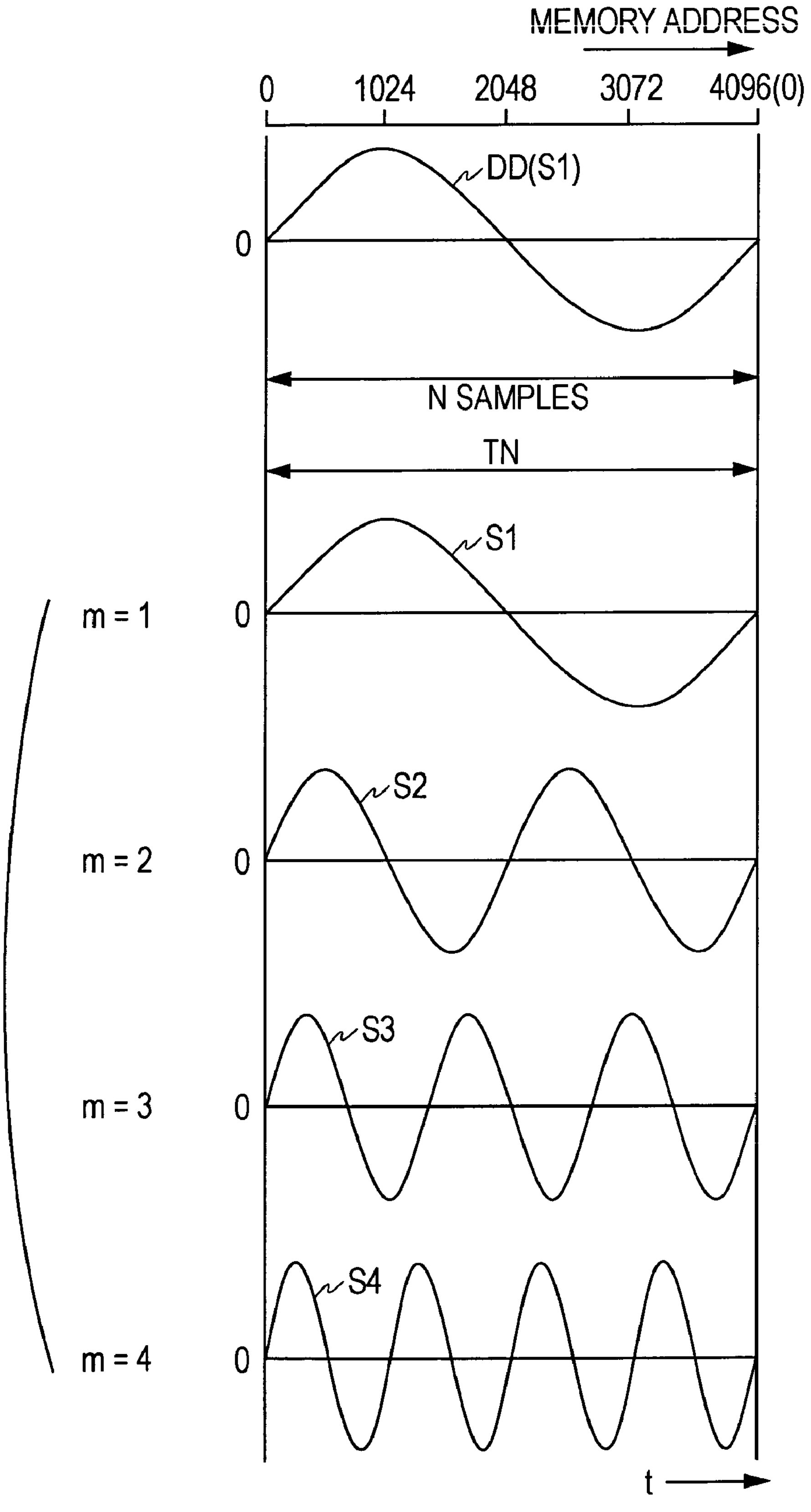
FIGS. 1A and 1B are waveform diagrams illustrating embodiments of the present invention.

It is assumed that digital data DD that is to be converted into one cycle of a sinusoidal signal S1, shown in FIG. 1A, by digital-to-analog conversion is stored in a memory. In this case, the digital data DD is given by sampling one cycle of the sinusoidal signal S1 in N samples. Accordingly, N samples form one cycle.

It is also assumed that the following equation is satisfied:

$$N=2\hat{\ }n \quad (1)$$

where n denotes a natural number and ^ denotes power ("2^n" denotes two to the n-th power). In this example, for example, n=12 and, therefore, N=4096.

It is further assumed that the samples of the digital data DD are written in the memory from "0" address to "4095" address in ascending order and that the digital data DD has a common format in digital audio. For example, the digital data DD has a quantifying bit number of 16 and is two's complement.

It is further assumed that "fS" denotes a clock frequency when the digital data DD is read out from the memory, "f1"

denotes a frequency of the sinusoidal signal S1 (f1=fs/N), and "TN" denotes one cycle period of the sinusoidal signal S1 (TN=1/f1).

$$\text{If } fS = 48 \text{ [kHz]}, \quad f1 = fS/N = 48000/4096 \approx 11.72\text{[Hz]} \tag{2}$$

Accordingly, when the digital data DD is read out from the memory at the clock frequency "fs", sequentially reading out the samples one by one from the addresses of the memory gives one cycle of the sinusoidal signal S1 having a frequency of 11.72 Hz (=f1) in the period TN, as shown in m=1 in FIG. 1B.

When the digital data DD is read out from the memory, reading out the sample every two addresses and repeating the readout two times give two cycles of a sinusoidal signal S2 having a frequency of 23.44 Hz (=2f1) in the period TN, as shown in m=2 in FIG. 1B.

When the digital data DD is read out from the memory, reading out the sample every three addresses and repeating the readout three times give three cycles of a sinusoidal signal S3 having a frequency of 35.16 Hz (=3f1) in the period TN, as shown in m=3 in FIG. 1B.

The same applies to the subsequent cases. That is, when the digital data DD is read out from the memory, reading out the sample every m addresses and repeating the readout m times give m cycles of a sinusoidal signal Sm having a frequency (mf1) that is m times higher than the frequency f1 in the period TN.

Accordingly, the following equation is satisfied from Equation (2):

$$fm = f1 \times m = fs/N \times m \tag{3}$$

where "fm" denotes a frequency of the sinusoidal signal Sm generated in the period TN.

When m (m is a natural number) cycles of the sinusoidal signal Sm are fall within the period TN, as described above, frequency analysis of the sinusoidal signal Sm by fast Fourier transform (FFT) generates an amplitude only at the frequency positions of the sinusoidal signal Sm and generates no amplitude at other frequency positions. Consequently, it is not necessary to execute a window function in the frequency analysis to simplify the analysis.

Since the number of samples in the memory is given by Equation (1), it is unlikely to cause waste in the memory. Furthermore, it is possible to yield the digital data DD in one cycle by, for example, providing the first ¼ cycle of the digital data DD in the memory; reading out the digital data DD from the addresses of the memory in ascending order in the first ¼ cycle and reading out the digital data DD from the addresses of the memory in descending order in the second ¼ cycle; and reading out the digital data DD from the addresses of the memory in ascending order in the third ¼ cycle, reading out the digital data DD from the addresses of the memory in descending order in the fourth ¼ cycle, and inverting the sign (polarity) of the readout data. As a result, the memory area can be saved.

It is assumed that N=4096 and fs=48 kHz, as described above, when numerical values are shown in the following description.

Tonal Scale

Calculation of the frequency fm of the sinusoidal signal Sm according to Equation (3) when m=18 to 37 gives values shown in the second column in FIG. 2. These values of the frequency fm correspond to pitch names and frequencies of equal temperament shown in the third column in FIG. 2. The frequencies of equal temperament in FIG. 2 are approximate values with respect to a frequency 445 Hz.

For example, when m=20, the frequency f20 of the sinusoidal signal S20 is equal to 234.375 Hz. This frequency f20 corresponds to a sound having a pitch name A# (a sound of a pitch having a frequency of equal temperament of 235.896 Hz). Generally, it is said that the difference in pitch cannot be discriminated if the pitch is about three cents or less.

Accordingly, varying the value m gives the sounds having the pitch names shown in the third column in FIG. 2. This means that supplying the sinusoidal signal Sm to the speaker and varying the value m of the sinusoidal signal Sm allow a melody (music) to be played by using the sounds having the pitch names A, A#, B, C#, D#, F, F#, G, and G# shown in the third column in FIG. 2. As a result, supplying the sinusoidal signal Sm to the speaker allows the connection of the speaker to be checked, and sequentially varying the value m produces a melody formed of the test tones output from the speaker.

The values m may be made two raised to the power of values in FIG. 2, although not shown. In this case, it is possible to use sounds having frequencies an octave higher than the sounds having the pitch names in FIG. 2.

Harmonic Tone $$fmp = fm \times p = fs/N \times m \times p \tag{4}$$

where "Smp" denotes a harmonic tone signal of the p-th degree of the sinusoidal signal Sm and "fmp" denotes a frequency of the harmonic tone signal Smp. If p=1, fmp=fm and Smp=Sm.

The harmonic tone signal Smp of the p-th degree is also a harmonic tone signal on the basis of a fundamental tone that is generated from the sinusoidal signal Sm. That is, the signal Sm is the fundamental tone signal and the signal Smp is the harmonic tone signal for the fundamental tone signal.

When the fundamental tone signal Sm is mixed with the harmonic tone signals Smp to reproduce sounds, the reproduced sounds have the same pitch but have different tones if the fundamental tone signal Sm has the constant frequency fm even though the harmonic tone signals Smp have different frequencies fmp.

Accordingly, supplying the mixed signals generated by mixing the fundamental tone signal Sm with multiple harmonic tone signals Smp having different degrees p to the speaker allows various frequency components to be supplied to the speaker. Even if the frequency characteristic of the speaker has a dip or a standing wave exists in the room, it is possible to correctly check whether the speaker is connected.

According to the embodiments of the present invention, the fundamental tone signal Sm is mixed with the multiple harmonic tone signals Smp to generate a test tone signal STT.

Frequency Components of Test Tone Signal STT

FIG. 3 is a table showing examples of the harmonic tone signals Smp included in the test tone signal STT. In the examples in FIG. 3, one fundamental tone signal Sm is mixed with five harmonic tone signals Smp. The first and second columns in FIG. 3 show the pitch names and their values m of the sounds provided by the fundamental tone signal Sm of the test tone signal STT. The pitch names and their values m in the first and second columns in FIG. 3 correspond to those in the third and first columns in FIG. 2.

Figure 4:
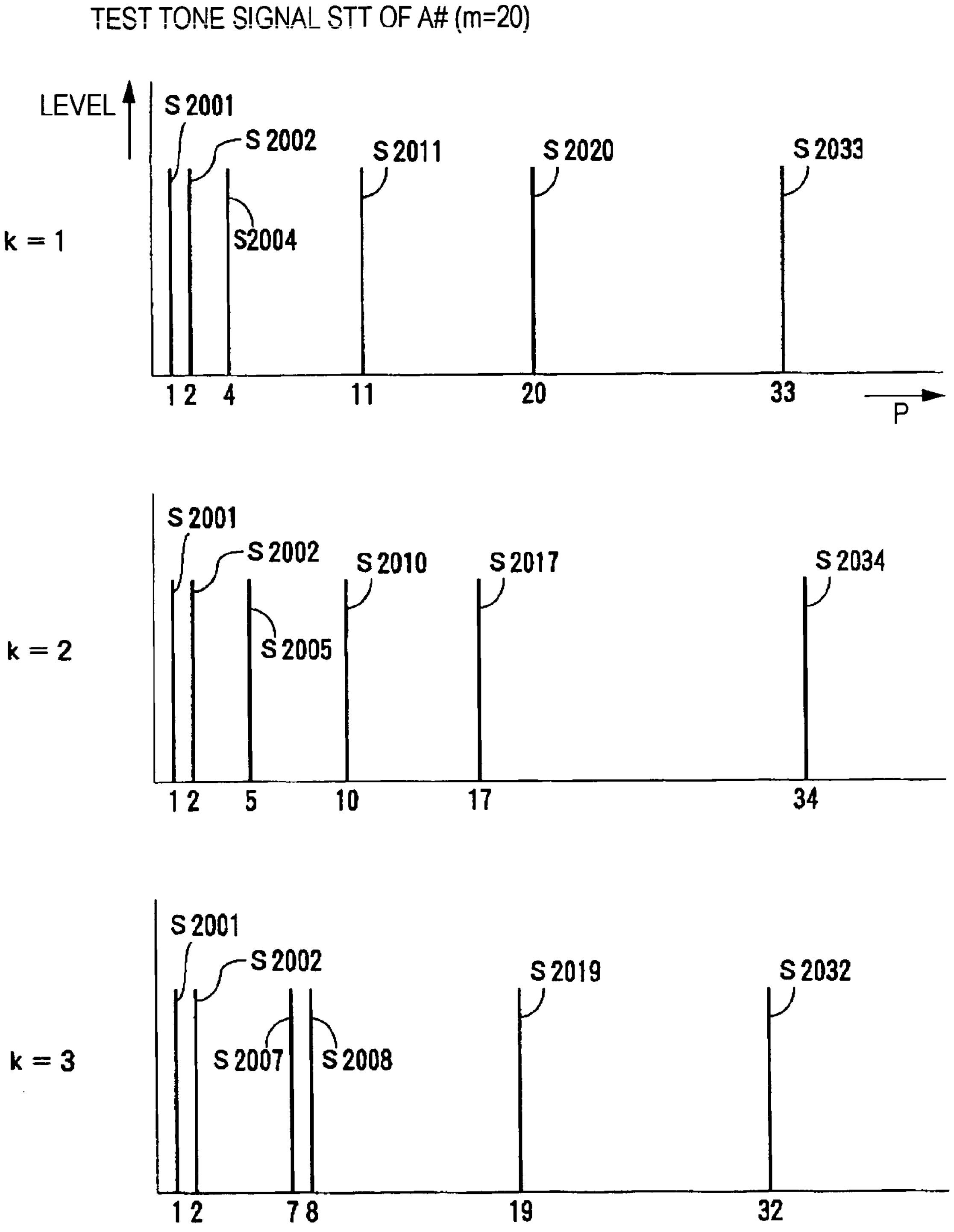
FIG. 4 includes diagrams showing frequency spectra illustrating the embodiments of the present invention.

Variables k in the third column show combination numbers of the fundamental tone signal Sm and the five harmonic tone signals Smp. Variables p in the fourth column show degrees of the harmonic tone signals Smp mixed with the fundamental tone signal Sm. For example, the pitch name A# has three values 1 to 3 for the variable k. As also shown in FIG. 4, if k=1, the fundamental tone signal S20 (m=20) is mixed with the harmonic tone signals S2002, S2004, S2011, S2020, and S2033 (p=2, 4, 11, 20, and 33) to generate the test tone signal STT.

If k=2, the fundamental tone signal S20 (m=20) is mixed with the harmonic tone signals S2002, S2005, S2010, S2017, and S2034 (p=2, 5, 10, 17, and 34) to generate the test tone signal STT. If k=3, the fundamental tone signal S20 (m=20) is mixed with the harmonic tone signals S2002, S2007, S2008, S2019, and S2032 (p=2, 7, 8, 19, and 32) to generate the test tone signal STT.

Referring to FIG. 3, when the combination k is varied for the same pitch name, the harmonic tone signal Smp in p=2 is fixed but only the four harmonic tone signals Smp (the harmonic tone signals Smp having the values other than two (p≠2)) having higher frequencies are varied in value p in order not to damage the image of the sounds that have the same pitch name but have different combinations of the harmonic tones (different variables k).

The frequency f2033 of the harmonic tone signal S2033 in p=33 in k=1 of the pitch name A# (m=20) is calculated according to Equation (4) as follows:

$$\begin{aligned} f2033 &= 48000/4096\times 20\times 33 \\ &\approx 7734.4 \ \text{[Hz]} \end{aligned}$$

Referring to FIG. 3, the harmonic tone signal Smp having the highest frequency is the harmonic tone signal S3634 in p=34 in k=2 of the pitch name G# (m=36) . The frequency f3634 of the harmonic tone signal S3634 is calculated according to Equation (4) as follows:

$$\begin{aligned} f3634 &= 48000/4096\times 36\times 34 \\ &\approx 14343.8 \ \text{[Hz]} \end{aligned}$$

This means that the test tone signal STT includes the frequency components over a wide range in an audio frequency band.

Since the sounds having the pitch names A and B, in FIG. 3, are not used, the degree p of the corresponding harmonic tone signal S19*p* and S21*p* is blank. For example, the pitch name C# does not have the combination in k=3 for the same reason. Conversely, the number of combinations, or variables k may be increased if more combinations are necessary for the sound having the pitch name A#.

Output Format of Test Tone Signal STT

FIG. 5A shows a format (timing chart) when the test tone signal STT is output. The test tone signal STT is generated during a test period TT, which includes a preparation period TR, a check period TC, and a rendering period TE.

During the preparation period TR, the volume of a test tone that is to be output from the speaker during the subsequent check period TC is set to an appropriate value. During the check period TC, connection of the speaker of each channel is actually checked. The rendering period TE is used for rendering termination of the test tone and is not used for checking the connection of the speaker.

The preparation period TR, the check period TC, and the rendering period TE each include four unit periods TU. Each unit period TU has a length corresponding to the two cycles TN in FIG. 1A, as shown in FIG. 5B. The frequency component of the test tone signal STT is varied every unit period TU.

The test tone signal STT is generated by mixing the fundamental tone signal Sm with the harmonic tone signal Smp, and the number of cycles of the fundamental tone signal Sm and the harmonic tone signal Smp in the period TN is an integer. Accordingly, the phase of the test tone signal STT is smoothly varied even in a boundary between the periods TN in the unit period TU and in a boundary between the unit period TU and the subsequent unit period TU.

With the above numeric values, $$\begin{aligned} TU &= TN\times 2 \\ &= 4096/48000\times 2 \\ &= 171 \ \text{[msec]} \end{aligned}$$

The test period TT is calculated by the following equation:

$$\begin{aligned} TT &= TR + TC + TE \\ &= TU\times 4\times 3 \\ &= 2.048 \ \text{[sec]} \end{aligned}$$

After the test tone signal STT is supplied to a speaker under test, the sound having the frequency component corresponding to the test tone signal STT is output from the speaker under test. After the sound output from the speaker under test is picked up with a microphone, the test tone signal STT is output from the microphone, as shown in FIG. 5C (the test tone signal STT output from the microphone is hereinafter referred to as a “reply signal STT”). In this case, the reply signal STT is delayed by a time Td corresponding to the distance between the speaker under test and the microphone with respect to the test tone signal STT (in FIG. 5B) supplied to the speaker.

Hence, as shown in FIG. 5D, the frequency analysis of the reply signal STT over a predetermined analysis period TA for every unit period TU of the reply signal STT output from the microphone can check whether the speaker under test is connected and can also check the frequency characteristic etc. of the corresponding channel.

Since the same content is repeated twice during the two periods TN in the unit period TU of the reply signal STT output from the microphone, as shown in FIG. 5C, there is room for the time position of the analysis period TA. Accordingly, for example, when the reply signal STT is output from the microphone, the frequency analysis of the reply signal STT may be started upon rising of the output reply signal STT. In this case, it is not necessary to strictly consider the delay time Td of the picked-up reply signal STT.

Since the test tone signal STT is generated by mixing the fundamental tone signal Sm with the harmonic tone signals Smp, making the analysis period TA equal to the period TN causes the number of cycles of the reply signal STT during the analysis period TA to be an integer. Hence, it is not necessary to execute the window function in the frequency analysis, thus simplifying the analysis.

Content of Test Tone Signal STT

Figure 6:
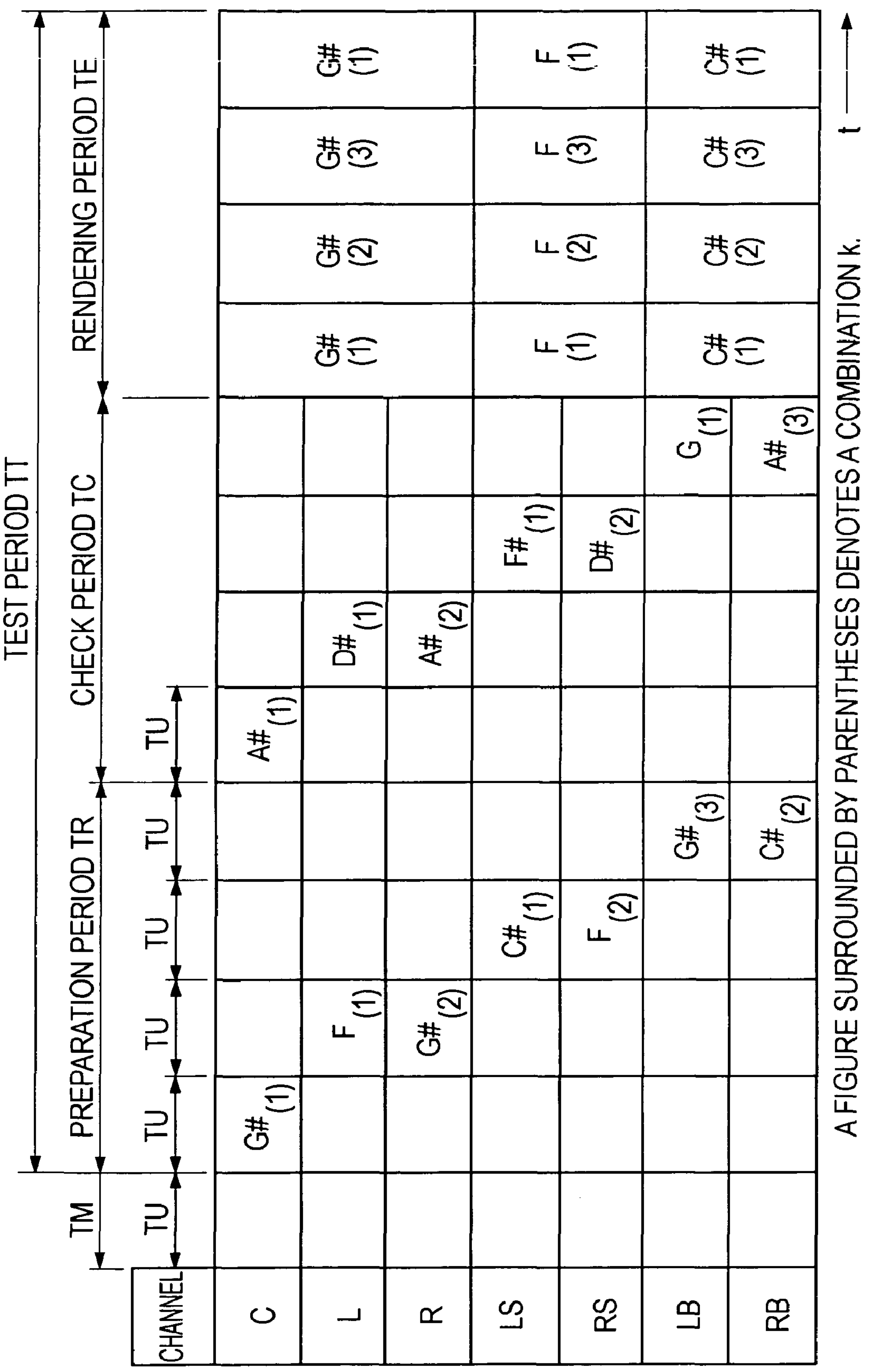
FIG. 6 is a table illustrating the embodiments of the present invention.

FIG. 6 illustrates the relationship between audio channels and the pitch names of the sounds included in the test tone signal STT. FIG. 6 illustrates 7.1-channel reproduction. The vertical axis represents the following channels:

| | |
|---|---|
| C: center channel | |
| L: left front channel | R: right front channel |
| LS: left surround channel | RS: right surround channel |
| LB: left rear channel | RB: right rear channel |

The horizontal axis represents the test period TT including the preparation period TR, the check period TC, and the rendering period TE, each of which includes the four unit periods TU. The pitch name of the sound used for checking the speaker is shown in each cell in FIG. 6.

For example, during the first unit period TU in the preparation period TR, the test tone signal STT includes the fundamental tone signal Sm having the pitch name G# and is supplied to the speaker of the center channel C. Accordingly, the sound of the pitch name G# is output from the speaker of the center channel C during the first unit period TU.

During the second unit period TU in the preparation period TR, the test tone signal STT includes the fundamental tone signals Sm having the pitch name F and pitch name G#. The test tone signal STT including the fundamental tone signal Sm having the pitch name F is supplied to the speaker of the left front channel L and the test tone signal STT including the fundamental tone signal Sm having the pitch name G# is supplied to the right front channel R. Accordingly, the sound of the pitch name F is output from the speaker of the left front channel L and the sound of the pitch name G# is output from the speaker of the right front channel R during the second unit period TU.

During the third unit period TU in the preparation period TR, the test tone signal STT includes the fundamental tone signals Sm having the pitch name C# and pitch name F. The test tone signal STT including the fundamental tone signal Sm having the pitch name C# is supplied to the speaker of the left surround channel LS and the test tone signal STT including the fundamental tone signal Sm having the pitch name F is supplied to the right surround channel RS. Accordingly, the sound of the pitch name C# is output from the speaker of the left surround channel LS and the sound of the pitch name F is output from the speaker of the right surround channel RS during the third unit period TU.

The test tone signal STT including the fundamental tone signals Sm having the corresponding pitch names is supplied to each channel in the same manner as described above. Hence, the sounds of the pitch names are output from the speakers of the channels in a pattern shown in FIG. 6. Referring to FIG. 6, the unit period TU in a blank cell has no signal (is mute). During a period TM having a length TU immediately before the test period TT, all the channels have no signal for a reason described below and all the channels are mute.

The frequencies of the fundamental tone signals Sm included in the test tone signal STT are varied so as to output the sounds having the pitch names shown in FIG. 6 when the test tones are output from the speakers. In contrast, the variables k showing the combination numbers of the fundamental tone signal Sm and the harmonic tone signals Smp are varied in accordance with the numeric values shown in parentheses in FIG. 6.

Specifically, during the first unit period TU in the preparation period TR, the test tone signal STT having the pitch name G# is supplied to the center channel C, and the test tone signal STT during the first unit period TU is generated by mixing the fundamental tone signal Sm with the harmonic tone signals Smp in k=1.

During the second unit period TU in the preparation period TR, the test tone signal STT having the pitch name G# is supplied to the right front channel R, and the test tone signal STT during the second unit period TU is generated by mixing the fundamental tone signal Sm with the harmonic tone signals Smp in k=2. In addition, during the second unit period TU in the preparation period TR, the test tone signal STT having the pitch name F is supplied to the left front channel L, and the test tone signal STT during the second unit period TU is generated by mixing the fundamental tone signal Sm with the harmonic tone signals Smp in k=1.

Similarly, when the same pitch name is used, particularly when the sound having the same pitch name is used during the continuous two unit periods TU, as in the first and second unit periods TU in the preparation period TR, the variables k showing the combination numbers of the fundamental tone signal Sm and the harmonic tone signals Smp are varied in accordance with the numeric values shown in parentheses in FIG. 6. Accordingly, for example, although the sounds of the same pitch name G# are output during the first unit period TU and the second unit period TU in the preparation period TR, the signals output during the first and second unit periods TU have different frequency components and different tones.

Even when the sounds of the same pitch name are used during the continuous two unit periods TU, varying the variables k showing the combination numbers of the harmonic tone signals Smp allows the check to be more correctly performed. In other words, since a room where the audio reproduction is performed usually contains a certain amount of acoustic reverberation, the acoustic reverberation during one unit period TU sometimes remains until the analysis period TA (FIG. 5D) in the subsequent unit period TU.

However, varying the variables k showing the combination numbers every unit period TU, as described above, allows the acoustic reverberation during the previous unit period TU to be filtered in the analysis, so that it is possible to check whether the speaker is connected without being affected by the reverberation and, therefore, the connection can be correctly checked.

In order to vary the components of the test tone signal STT as shown in FIG. 6, a "tone frequency list" and a "tone sequence list" should be provided. The tone frequency list includes the correspondence between the pitch names and the variables m, p, and k, as shown in FIG. 3. The tone sequence list includes the correspondence between the channels, the pitch names, and the variables k for every unit period TU, as shown in FIG. 6.

Referring to the tone frequency list and the tone sequence list in the generation of the test tone signal STT to vary the variables m, p, and k for every channel and for every unit period TU allows the test tone to be output in the pattern in FIG. 6.

Background Noise and Method of Determining Speaker Connection

As shown in FIG. 6, all the channels has no signal and are mute during the period TM having a length of unit period TU immediately before the test period TT. This mute period TM is provided in order to avoid an effect of background noise on the checking of the connection of the speaker.

When the test tone output from the speaker is picked up and the reply signal STT yielded from the pickup of the test tone is analyzed to measure the level of each frequency component of the test tone, the analytical result (frequency components) contains the frequency component of the background noise. Accordingly, it is necessary to consider the frequency component of the background noise in the determination of the connection of the speaker from the analytical result of the test tone. An exemplary method of determining the connection of the speaker in consideration of the background noise will now be described.

Figure 7A:
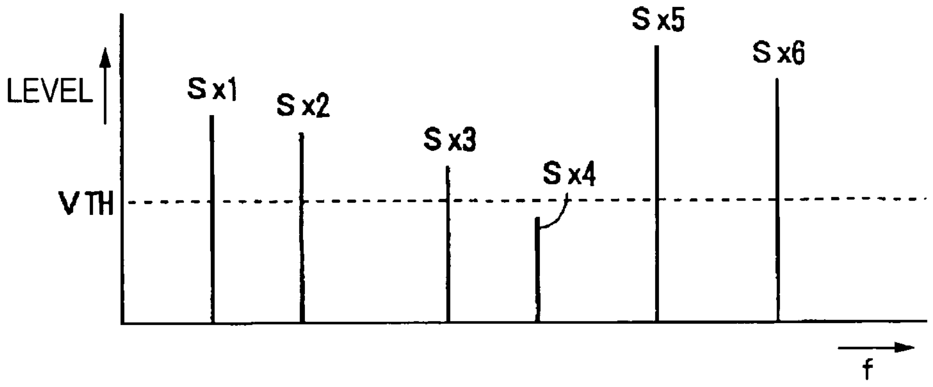
FIGS. 7A and 7B are diagrams showing frequency spectra illustrating the embodiments of the present invention.
Figure 7B:
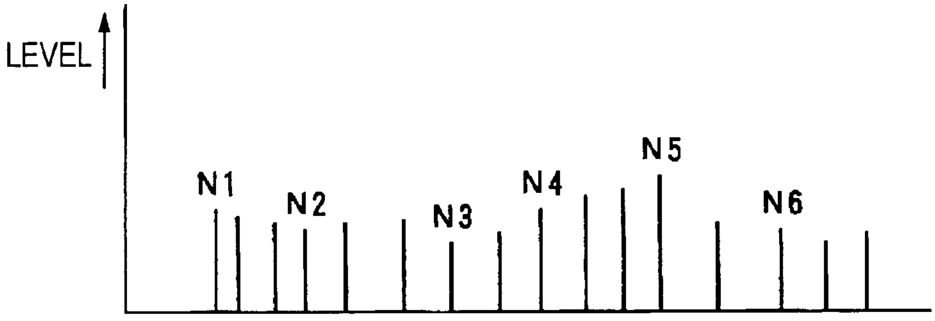

First, the background noise during the mute period TM is picked up to perform the frequency analysis, the level of each frequency component is calculated, as shown in FIG. 7B, and the calculated level is temporarily stored. Here, it is sufficient to store the levels of only the components of the frequencies equal to those of the fundamental tone signal Sm and the harmonic tone signals Smp included in the test tone signal STT and it is not necessary to store the levels of the components of other frequencies. The frequencies to be stored can be determined from the tone frequency list.

Next, during the preparation period TR, the test tone signal STT is supplied to the speaker under test and the test tone output from the speaker under test is picked up. The reply signal STT yielded from the pickup of the test tone is subjected to the frequency analysis and the level of each frequency component is calculated, as shown in FIG. 7A. Referring to FIG. 7A, signals Sx1 to SX6 show the frequency components of the fundamental tone signal Sm and the five harmonic tone signals Smp and the remaining frequency components are of the background noise. The signals Sx1 to Sx6 generally have different levels depending on the frequency characteristic of the speaker and include the frequency components of the background noise.

A signal to noise (S/N) ratio of the signal Sx1 to a noise component N1 having a frequency equal to that of the signal Sx1, among the noise components whose levels are stored (FIG. 7B), is calculated and the calculated S/N ratio is set as a value V1. Similarly, S/N ratios of the signals Sx2 to Sx6 to noise components having frequencies equal to those of the signals Sx2 to Sx6 are respectively calculated and the calculated S/N ratios are set as values V2 to V6. If the signals Sx1 to Sx6 includes a signal Sx1 (signal Sx4 in FIG. 7A) having a level less than a predetermined value VTH, the above S/N ratio is not calculated and the corresponding value Vi is set to zero.

Among the values V1 to V6, a value Vj (j is any of one to six) having the highest S/N ratio is selected and the value Vj is compared with a predetermined value VREF. It is determined that the checked speaker is connected if Vj>VREF and that the checked speaker is not connected if Vj≦VREF.

In the above method, the value of the highest S/N ratio, among the S/N ratios of the sinusoidal signal Sm and the harmonic tone signals Smp included in the reply signal STT to the noise components, is compared with the predetermined value VREF to determine whether the corresponding speaker is connected. Accordingly, it is possible to correctly determine whether the speaker is connected without being affected by the frequency characteristic of the speaker or the standing wave in the room.

When the acoustic reverberation is continued, it is preferable that the maximum values among the values V3 to V6, instead of the maximum value among the values V1 to V6, be compared with the predetermined value VREF, in consideration of the long decay time in lower frequencies. The comparison of the maximum value, among the values V3 to V6, with the predetermined value VREF reduces the effect of the acoustic reverberation, thereby preventing erroneous determination to improve the accuracy of the determination.

Audio-Visual Reproducing Apparatus

Figure 8:
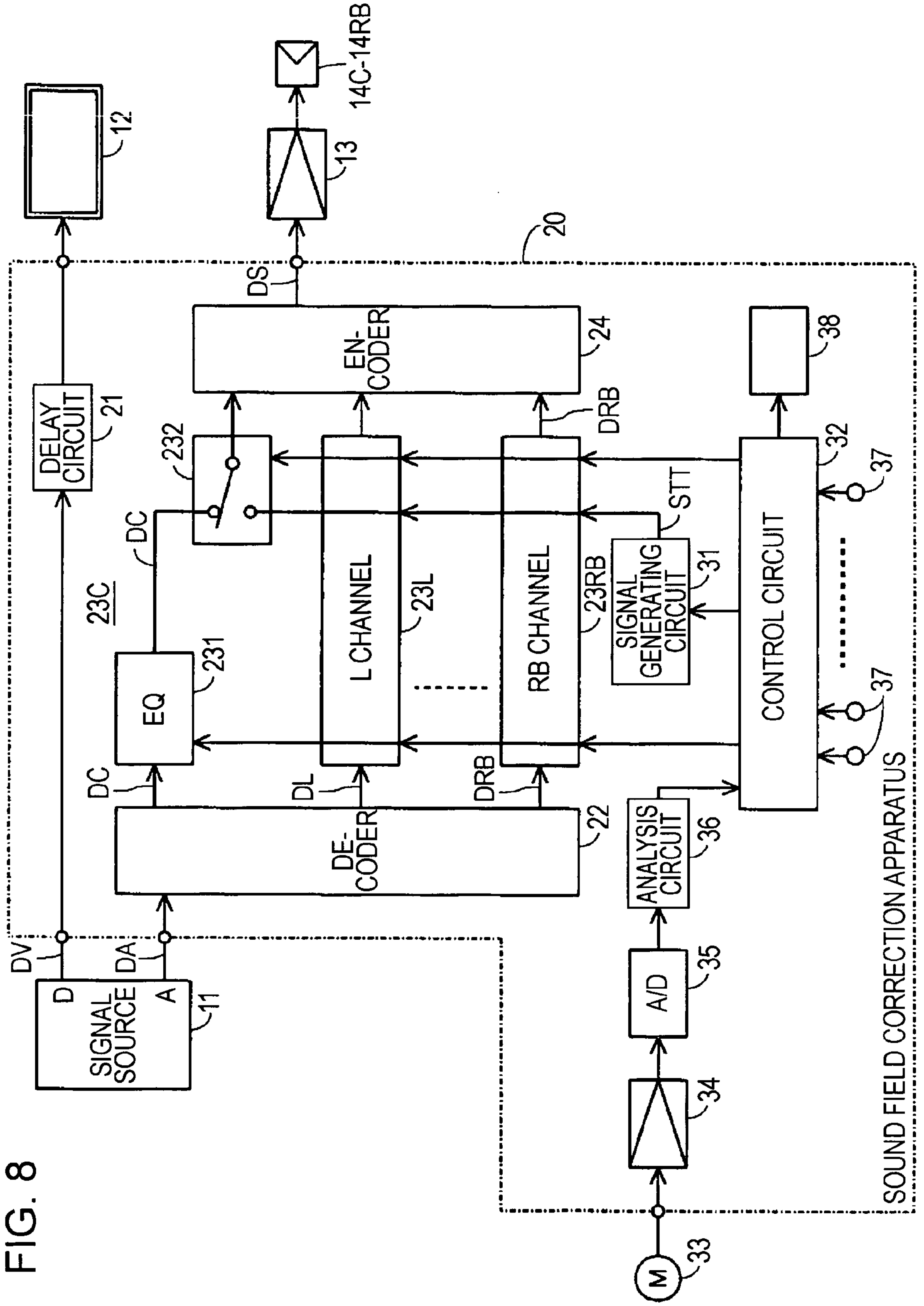
FIG. 8 is a block diagram showing a sound field correction device according to an embodiment of the present invention.

FIG. 8 is a block diagram showing a sound field correction device 20 according to an embodiment of the present invention. In the example in FIG. 8, the sound field correction device 20 is included in an existing AV reproducing apparatus as an adaptor.

Example of Reproducing System

Referring to FIG. 8, the AV reproducing apparatus includes a signal source 11 of an AV signal, a display 12, a digital amplifier 13, and speakers 14C to 14RB. The signal source 11 is, for example, a digital versatile disk (DVD) player or a satellite tuner. In the example in FIG. 8, an output from the signal source 11 has a digital visual interface (DVI) format. A digital video signal DV and digital audio signals for the seven channels, which are encoded into one serial signal DA, are output from the signal source 11.

The display 12 receives an input in the DVI format and normally receives the digital video signal DV output from the signal source 11. The digital amplifier 13 is a class D amplifier. Specifically, the digital amplifier 13 also normally receives the digital audio signal DA output from the signal source 11. The digital amplifier 13 separates the digital audio signal DA into signals for the respective channels and performs the class D amplification for the signals for the respective channels to output analog audio signals for the respective channels.

The audio signals output from the digital amplifier 13 are supplied to the speakers 14C to 14RB for the respective channels. The speakers 14C to 14RB are arranged at the center, the left front side, the right front side, the left side, the right side, the left rear side, and the right rear side, respectively.

Sound Field Correction Device

Exemplary Structure of Sound Field Correction Device

Referring to FIG. 8, the sound field correction device 20 according to the embodiment of the present invention is connected to a signal line between the signal source 11 and the display 12 and digital amplifier 13. The digital video signal DV output from the signal source 11 is supplied to the display 12 through a delay circuit 21. The delay circuit 21 is used for lip synchronization, which delays the digital video signal DV by a time corresponding to a delay time of the digital audio signal DA for the sound field correction to synchronize an image with the corresponding reproduced sound. The delay circuit 21 is, for example, a field memory.

In addition, in the sound field correction device 20, the digital audio signal DA output from the signal source 11 is supplied to a decoder circuit 22, where the digital audio signal DA is separated into digital audio signals DC to DRB for the respective channels. Among the digital audio signals resulting from the separation, the digital audio signal DC for the center channel is supplied to a correction circuit 23C for the center channel. The correction circuit 23C includes an equalizer circuit 231 and a switch circuit 232. The digital audio signal DC supplied from the decoder circuit 22 is supplied to the switch circuit 232 through the equalizer circuit 231.

In this case, the equalizer circuit 231 is, for example, a digital signal processor (DSP). The equalizer circuit 231 controls the delay, frequency, and phase characteristics and the level of the received digital audio signal DC to perform the sound field correction for the digital audio signal DC. The switch circuit 232 is connected in a manner shown in FIG. 8 during normal watching and listening, and is connected in a state reverse to the state in FIG. 8 when the connection of the speakers 14C to 14RB is checked. Accordingly, during the normal watching and listening, the audio signal DC subjected to the sound field correction, supplied from the equalizer circuit 231, is output from the switch circuit 232. The audio signal DC is supplied to an encoder circuit 24.

Furthermore, the audio signals DL to DRB for the remaining channels, separated by the decoder circuit 22, are supplied to the encoder circuit 24 through correction circuits 23L to 23RB. The correction circuits 23L to 23RB each have a structure similar to that of the correction circuit 23C. Hence, during the normal watching and listening, the audio signals DL to DRB subjected to the sound field correction are output from the correction circuits 23L to 23RB.

In the encoder circuit 24, the audio signals DC to DRB for the respective channels, supplied to the encoder circuit 24, are mixed into one serial signal DS and the serial signal DS is supplied to the digital amplifier 13. Hence, during the normal watching and listening, the digital audio signal DA supplied from the signal source 11 is subjected to the sound field correction in the correction circuits 23C to 23RB and is supplied to the speakers 14C to 14RB. As a result, a reproduced sound whose sound field is corrected to a state appropriate for the environment in which the speakers are arranged is output from the speakers 14C to 14RB.

In order to realize the sound field correction and the checking of whether the speakers 14C to 14RB are connected, a signal generating circuit 31 and a control circuit 32 are provided in the sound field correction device 20. The signal generating circuit 31 is a DSP and generates the test tone signal STT during the test period TT, as described above. The control circuit 32 is a microcomputer. When the signal generating circuit 31 generates the test tone signal STT, the control circuit 32 refers to the tone frequency list and the tone sequence list to control generation of the test tone signal STT and determines whether the speakers are connected on the basis of the analytical result during the analysis period TA.

A microphone 33 is provided for picking up test tones output from the speakers 14C to 14RB. The reply signal STT output from the microphone 33 is supplied to an analog-to-digital (A/D) converter circuit 35 through a microphone amplifier 34. The reply signal STT is converted into a digital signal in the A/D converter circuit 35.

The digital signal is supplied to an analysis circuit 36. The analysis circuit 36 is, for example, a DSP and performs frequency analysis for the test tone output from the speakers 14C to 14RB during the analysis period TA. The analytical result is supplied to the control circuit 32. Control signals are supplied from the control circuit 32 to equalizer circuit 231C to 231RB and switch circuits 232C to 232RB in the correction circuits 23C to 23RB. In addition, various operation switches 37 are connected to the control circuit 32 and a display device, for example, a liquid crystal display (LCD) panel 38 in which the check results are displayed is also connected to the control circuit 32.

Operation of Sound Field Correction Device 20

After a check switch among the operation switches 37 is operated, the mute period TM is started. During the mute period TM, the control circuit 32 causes the switch circuits 232C to 232RB in the correction circuits 23C to 23RB to be connected in the state reverse to the state in FIG. 8. The control circuit 32 controls the signal generating circuit 31 so that the test tone signal STT becomes a mute signal. Hence, no sound is output from the speakers 14C to 14RB.

The background noise during the mute period TM is picked up by the microphone 33. At the same time, the signal of the background noise that has been picked up is subjected to the frequency analysis in the analysis circuit 36, and the analytical result is supplied to the control circuit 32 and is stored therein.

Next, the sound field correction device 20 enters the test period TT. During the test period TT, the control circuit 32 causes the switch circuits 232C to 232RB in the correction circuits 23C to 23RB to be connected in the state reverse to the state in FIG. 8. The control circuit 32 controls the signal generating circuit 31 so that the test tone signal STT is generated, and the generated test tone signal STT is supplied to the switch circuits 232C to 232RB. The fundamental tone signal Sm and the harmonic tone signals Smp of the test tone signal STT are varied in the manner shown in FIG. 3 because the variables m, p, and k are varied for every unit period TU in the manner shown in FIG. 6, and the combination of the fundamental tone signal Sm and the harmonic tone signals Smp is also varied.

The test tone signal STT is supplied to the encoder circuit 24 through the switch circuits 232C to 232RB. The test tone signal STT is mixed into one serial signal DS in the encoder circuit 24, and the serial signal DS is supplied to the digital amplifier 13. As a result, the test tone is output from the speakers 14C to 14RB in the sequence shown in FIG. 6 during the preparation period TR, the check period TC, and the rendering period TE in the test period TT.

The test tone is picked up by the microphone 33. The picked-up reply signal STT is subjected to the frequency analysis every analysis period TA in the analysis circuit 36 and the analytical result is supplied to the control circuit 32.

Since the test tone signal STT during the preparation period TR is used for setting the output level from the speakers 14C to 14RB during the subsequent check period TC to an apparatus value, the level of the test tone signal STT is relatively low. The level of the test tone signal STT at this time can be determined in consideration of the analytical result of the background noise during the proximate mute period TM.

During the check period TC, it is determined whether the speaker of each channel is connected from the analytical result in the analysis circuit 36. The determination result is supplied to the LCD panel 38 in which the connection states of the speakers 14C to 14RB are displayed.

During the rendering period TE, the control circuit 32 controls the equalizer circuits 231C to 231RB in the correction circuits 23C to 23RB based on the analytical result during the check period TC so that the sounds output from the speakers 14C to 14RB have, for example, flat frequency characteristics.

After the test period TT is terminated, the control circuit 32 causes the switch circuits 232C to 232RB in the correction circuits 23C to 23RB to be connected in the state shown in FIG. 8. The control circuit 32 also controls the signal generating circuit 31 so that the test tone signal STT becomes mute. Hence, it is possible to reproduce the video signal DV and the audio signal DA from the signal source 11.

Example of Signal Generating Circuit 30

Figure 9:
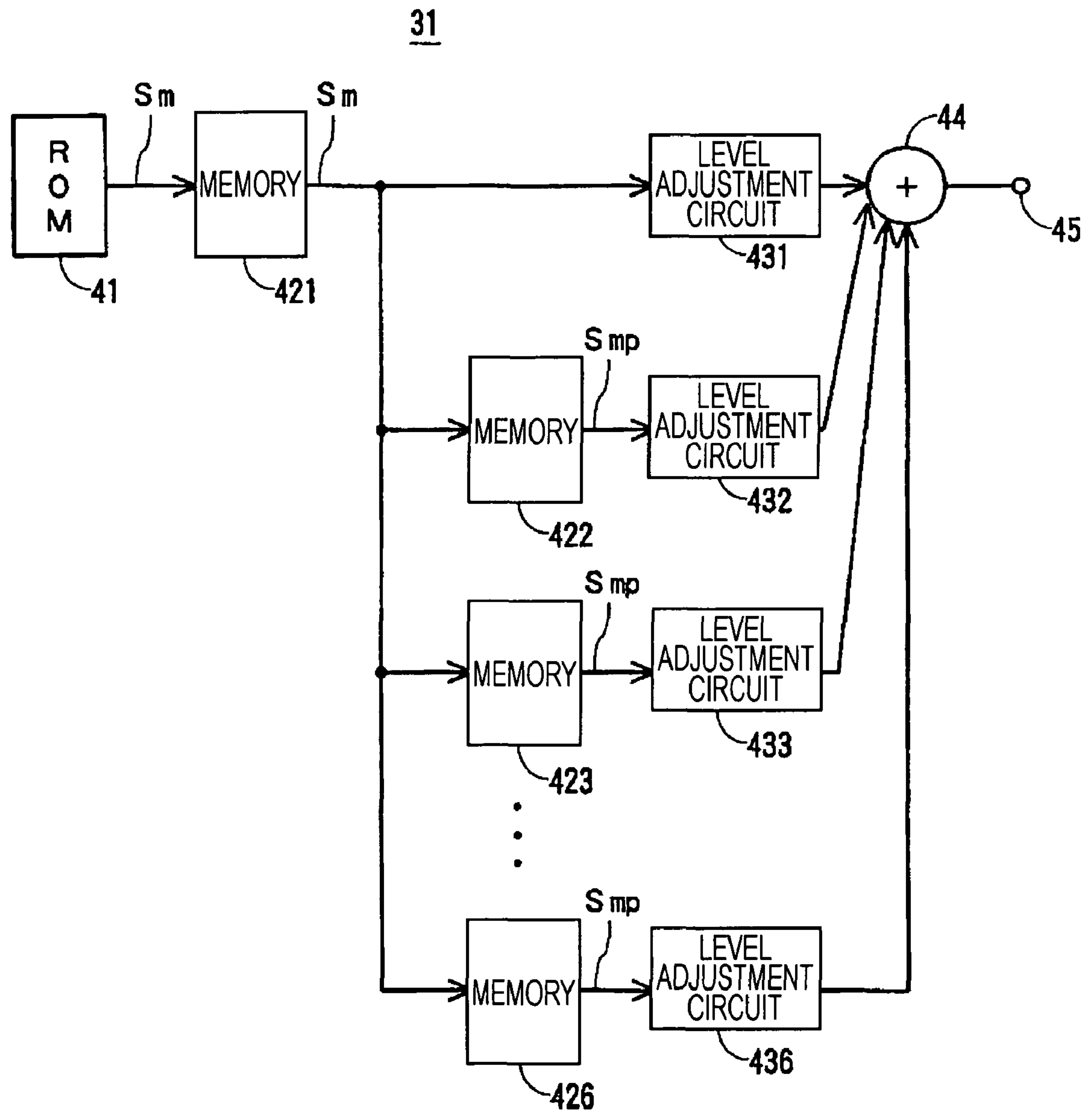
FIG. 9 is a block diagram showing part of the sound field correction device in FIG. 8.

FIG. 9 shows an example in which the signal generating circuit 31 is structured as a separate circuit. In the example in FIG. 9, the digital data DD to be converted into one cycle of the sinusoidal signal S1 shown in FIG. 1A is stored in a random access memory (ROM) 41. The digital data DD is read out at a ratio of one address per m addresses of the ROM 41 during the period TN. This readout is repeated m times to extract the sinusoidal signal Sm that is stored in a memory 421.

The sinusoidal signal Sm in the memory 421 is read out at a ratio of one address per p addresses of the memory 421. This readout is repeated p times to extract the harmonic tone signals Smp. The extraction of the harmonic tone signals Smp is performed five times with the degree p being varied in the manner shown in FIG. 3. Specifically, since p=2, 4, 11, 20, or 33 if the pitch name is A# and k=1, the harmonic tone signal Smp is extracted with p being equal to two in the first extraction, the harmonic tone signal Smp is extracted with p being equal to four in the second extraction, . . . , and the harmonic tone signal Smp is extracted with p being equal to 33 in the fifth extraction.

The harmonic tone signal Smp in the first extraction is stored in a memory 422, the harmonic tone signal Smp in the second extraction is stored in a memory 423, . . . and the harmonic tone signal Smp in the fifth extraction is stored in a memory 426. Accordingly, the sinusoidal signal Sm and the five harmonic tone signals Smp are concurrently stored in the memories 421 to 246.

The sinusoidal signal Sm and the harmonic tone signals Smp in the memories 421 to 426 are concurrently read out every period TN, and the readout sinusoidal signal Sm and harmonic tone signals Smp are subjected to level adjustment in level adjustment circuits 431 to 436 and are supplied to an adder circuit 44. The sinusoidal signal Sm and harmonic tone signals Smp are added in the adder circuit 44 and the added signal is extracted through a terminal 45. The signal extracted through the terminal 45 is distributed to the corresponding channel by a distribution circuit (not shown) and is output as the test tone signal STT.

The signal extracted through the terminal 45 corresponds to one channel of the test tone signal STT. In the examples in FIGS. 3 and 6, the test tone signals STT for three channels are concurrently processed. Hence, the signal generating circuits 31 in FIG. 9 for further two channels are provided and a signal resulting from mixing the added signals for the three channels is used as the test tone signal STT. When the signal generating circuit 31 is a DSP or a central processing unit (CPU), the processing in the memory 421 and the components downstream thereof should be performed for the digital data DD in the ROM 41.

Software for Checking Speaker Connection

Figure 10:
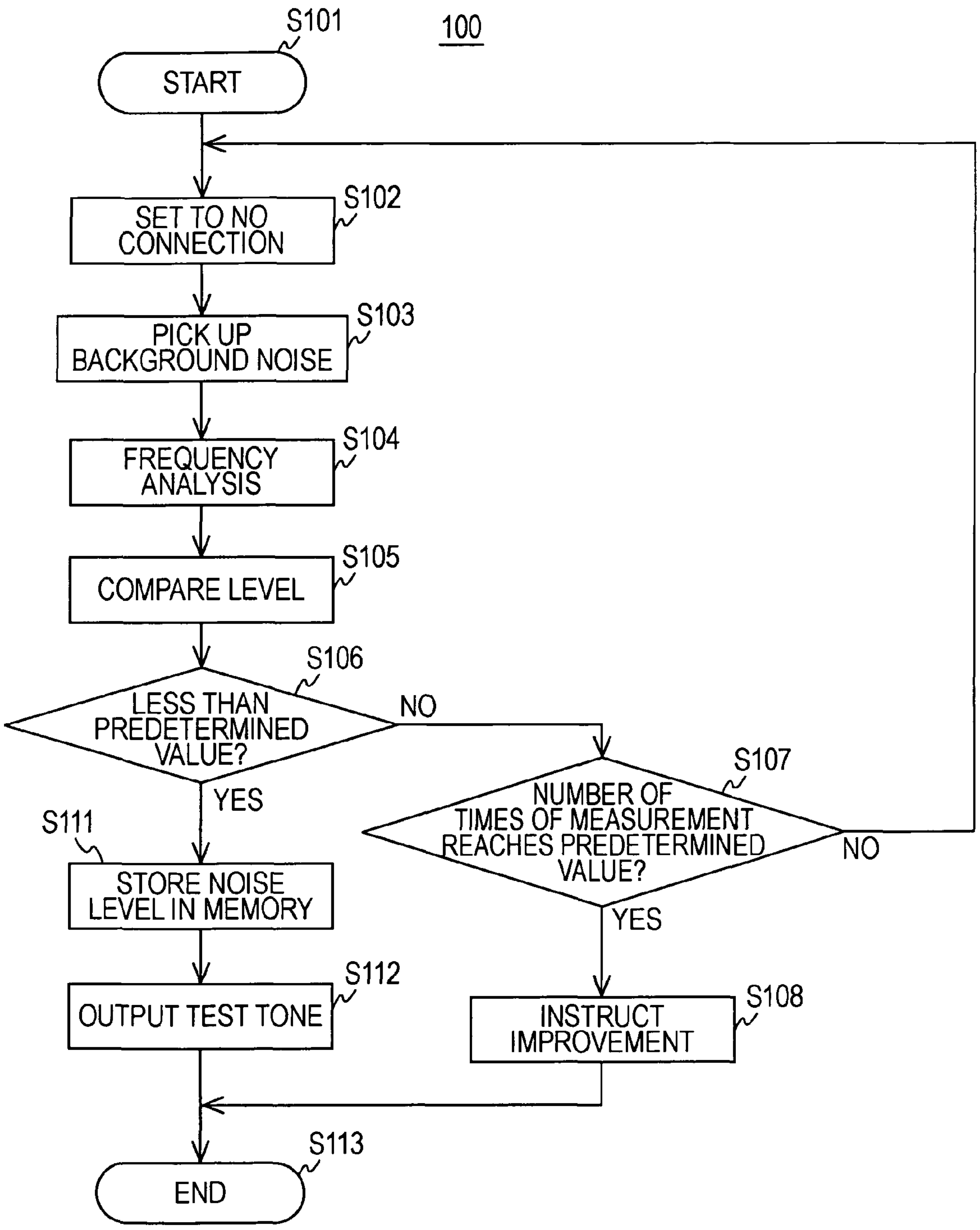
FIG. 10 is a flowchart showing a process in the sound field correction device in FIG. 8, according to an embodiment of the present invention.

FIG. 10 shows a routine 100 executed by the control circuit 32 in the above determination of whether the speaker is connected. The routine 100 includes the frequency analysis performed in the analysis circuit 36 (hence, the analysis circuit 36 is not connected).

When a check switch, among the operation switches 37, is operated, in Step S101, the routine 100 in the control circuit 32 is started (start of the mute period TM). In Step S102, it is presumed that no speaker is connected for all the channels that can be processed by the sound field correction device 20.

In Step S103, the background noise signal output from the A/D converter circuit 35 is supplied to the control circuit 32. In Step S104, the supplied background noise signal is subjected to the frequency analysis to measure the level of the background noise for every frequency component. In Step S105, the level of the background noise for every frequency component, measured in Step S104, is compared with a predetermined noise level VNL. This comparison should be performed for the frequency components having the frequencies equal to those of the sinusoidal signal Sm and harmonic tone signals Smp included in the test tone signal STT by referring to the tone frequency list.

In Step S106, the control circuit 32 determines whether the comparison result is less than the predetermined noise level VNL. If the noise level of any of the frequency components is less than the predetermined noise level VNL, the routine 100 proceeds from Step S106 to Step S111. In Step S111, the noise level for every frequency component, measured in Step S104, is stored in a memory in the control circuit 32 (termination of the mute period TM).

In Step S112, the signal generating circuit 31 is controlled in accordance with the tone sequence list and the tone frequency list to generate the test tone signal STT over the period from the preparation period TR to the rendering period TE, and the generated test tone signal STT is supplied to the digital amplifier 13. In Step S113, the routine 100 is terminated (termination of the rendering period TE).

If the control circuit 32 determines in Step S106 that the noise levels of all the frequency components exceed the predetermined noise level VNL, the routine 100 proceeds from Step S106 to Step S107. In Step S107, the control circuit 32 determines whether the number of times the background noise level is measured (measurement for every mute period TM) reaches a predetermined value. If the number of times the background noise level is measured does not reach the predetermined value, the routine 100 goes back from Step S107 to S102 to repeat the measurement of the background noise level for every frequency component.

If the control circuit 32 determines in Step S107 that the number of times the background noise level is measured reaches the predetermined value, the routine 100 proceeds from Step S107 to S108. In Step S108, for example, the control circuit 32 displays the necessity to improve the environment to reduce the background noise in the LCD panel 38. Then, in Step S113, the routine 100 is terminated.

Figure 5:
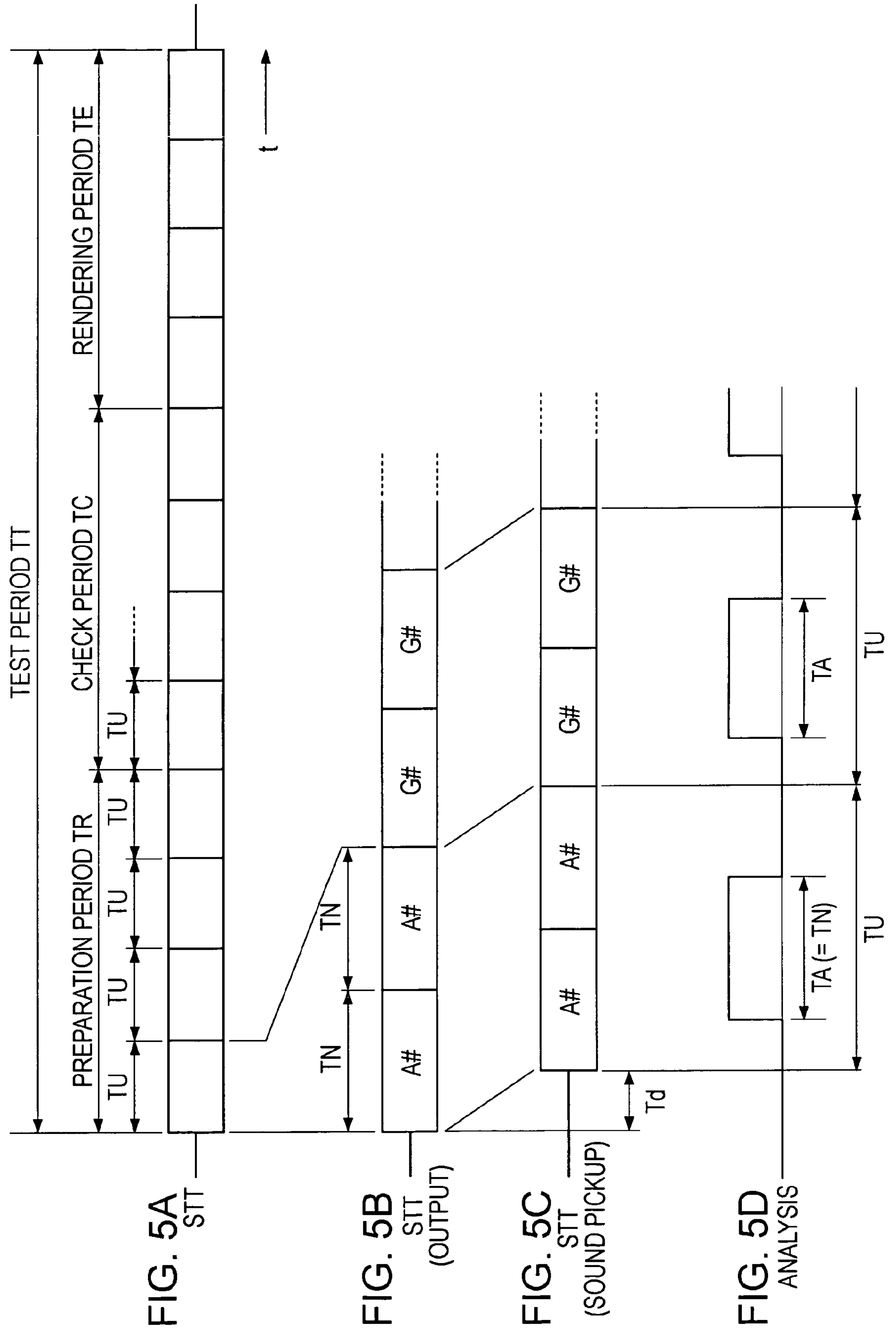
FIGS. 5A to 5D are timing charts illustrating the embodiments of the present invention.
Figure 11:
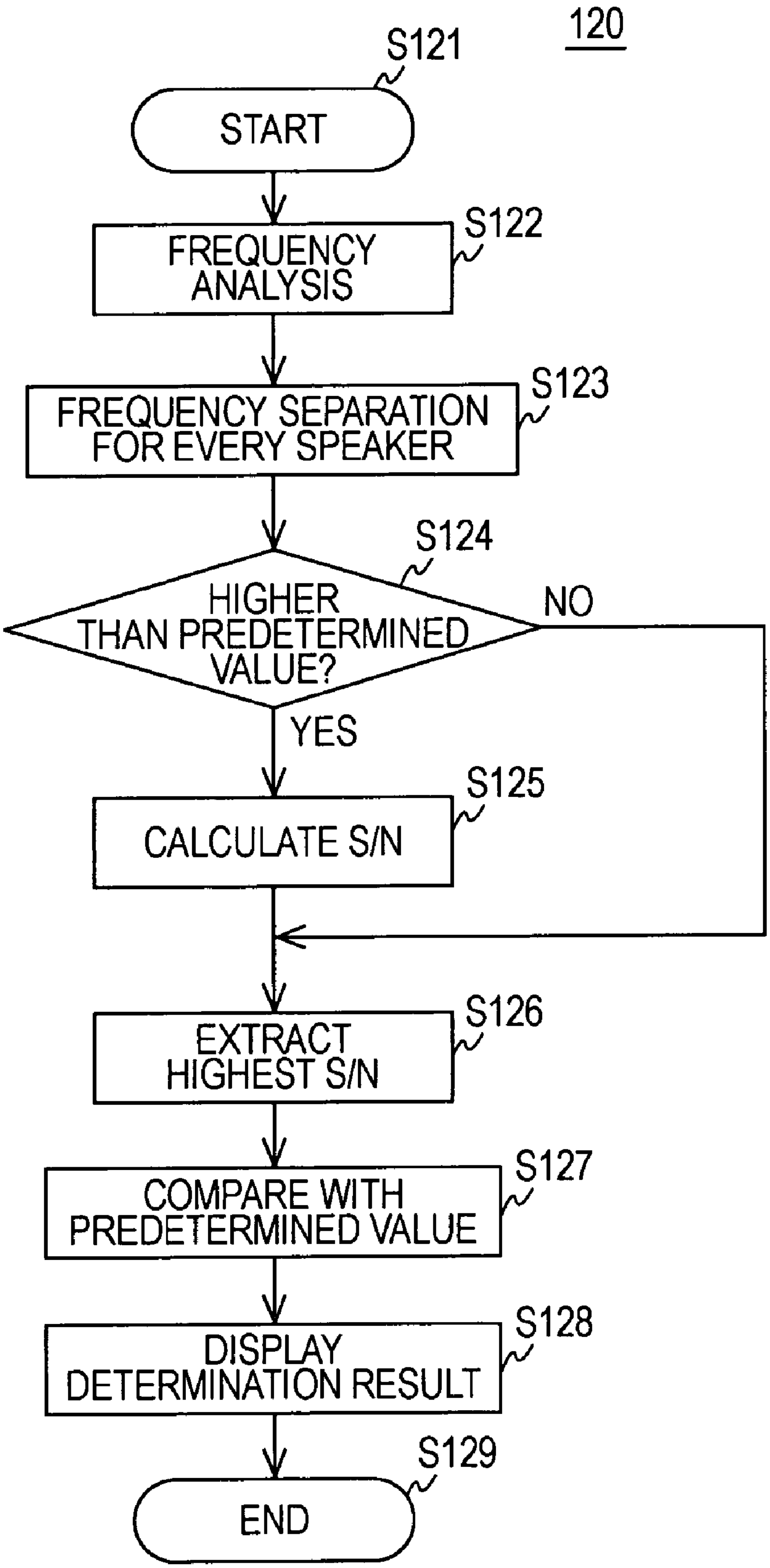
FIG. 11 is a flowchart showing another process in the sound field correction device in FIG. 8, according to an embodiment of the present invention.

A routine 120 shown in FIG. 11 is executed at timings shown in FIG. 5 in parallel with the generation of the test tone signal STT in Step S112. Referring to FIG. 11, in Step S121, the routine 120 is started. In Step S122, the reply signal STT output from the A/D converter circuit 35 is supplied to the control circuit 32 and is subjected to the frequency analysis during the analysis period TA. In Step S123, the frequency components subjected to the frequency analysis in Step S122 is subjected to frequency separation for every speaker (channel). This frequency separation is performed by referring to the tone frequency list and the tone sequence list.

In Step S124, the level of each frequency component, separated in Step S123, is compared with the predetermined value VTH (FIG. 7A) for every speaker. If the level of the frequency component is higher than the predetermined value VTH, the routine 120 proceeds from Step S124 to Step S125. If the level of the frequency component is lower than the predetermined value VTH, the routine 120 proceeds from Step S124 to Step S126.

In Step S125, the level of the frequency component, separated in Step S123, is compared with the level of the frequency component of the background noise, stored in Step S111, and the S/N ratios (the values V1 to V6: the values V3 to V6 for a higher accuracy) are calculated for every frequency component of the test tone signal STT. In Step S126, the test tone signal STT having the highest S/N ratio is extracted from the S/N ratios calculated in Step S125. In Step S127, the highest S/N ratio (value Vj), extracted in Step S126, is compared with the predetermined value VREF.

As described above, the comparison shows that the speaker under test is connected if Vj>VREF and that the speaker under test is not connected if Vj≦VREF. In Step S128, the determination result is supplied to the LCD panel 38 and the connection states of the speakers 14C to 14RB are displayed in the LCD panel 38. In Step S129, the routine 120 is terminated.

It is possible to determine whether the speaker of each channel is connected in the routines 100 and 120.

Summary

Since the test tone formed of the test tone signal STT composes a melody in the sound field correction device 20 described above, the test tone does not make a listener uncomfortable, unlike the pink noise. In addition, since the test tone signal STT is composed of the sinusoidal signal Sm and the harmonic tone signals Smp, the test tone signal STT includes various frequency components. As a result, it is possible to correctly check whether the speakers 14C to 14RB are connected even if the frequency characteristics of the speakers 14C to 14RB have dips or the standing wave exists in the room.

Because of the test tone signal STT including various frequency components, the analytical result can be used to check the frequency characteristics of sounds output from the speakers 14C to 14RB or correct the frequency characteristics. In addition, since the combination k of the sinusoidal signal Sm and the harmonic tone signals Smp included in the test tone signal STT is varied every unit period TU, the connection of the speakers 14C to 14RB can be checked in the analysis without being affected by the reverberation in the previous unit period TU, thus realizing the correct checking.

Since the unit period TU of the test tone signal STT corresponds to m cycles of the sinusoidal signal Sm, the test period TT can be set to around two seconds. Accordingly, stress is not applied to the listener not only when the checking of the connection is instructed with the operation switches 37 but also when the connection of the speakers 14C to 14RB is checked each time the AV apparatus or the sound field correction device 20 is turned on. On the contrary, the test tone composing a melody can be used as an opening sound indicating the startup of the apparatus.

Others

The sound field correction device 20 shown in FIG. 8 may be integrated with the signal source 11, the digital amplifier 13, or an AV amplifier (not shown). The digital audio signals DC to DRB output from the correction circuits 23C to 23RB may be supplied to a downstream amplifier directly or after being subjected to digital-to-analog (D/A) conversion.

The processing in the signal generating circuit 31 and the analysis circuit 36 may be realized by a microcomputer serving as the control circuit 32.

It should be understood by those skilled in the art that various modifications, combinations, sub-combinations and alterations may occur depending on design requirements and other factors insofar as they are within the scope of the appended claims or the equivalents thereof.

The invention claimed is:

1. A test-tone-signal generating circuit, comprising:

a fundamental tone generator configured to generate a fundamental tone signal, which is a sinusoidal signal having a predetermined frequency;

a harmonic tone generator configured to generate a plurality of harmonic tone signals having different frequencies that are integral multiples of the predetermined frequency;

an adder configured to add the fundamental tone signal to the harmonic tone signals to generate a test tone signal; and a controller configured to control the harmonic tone generator so as to generate a first group of the harmonic tone signals and a second group of the harmonic tone signals, at least part of the second group of the harmonic tone amplifying frequencies different from frequencies of the first group of the harmonic tone signals, wherein the controller outputs the test tone signal including the first group of the harmonic tone signals and the test tone signal including the second group of the harmonic tone signals at predetermined intervals.

2. The test-tone-signal generating circuit according to claim 1, wherein the fundamental tone generator includes:

a memory that stores digital data corresponding to one cycle of the sinusoidal signal, and a reading section that reads out the digital data for every the m-th address of the memory and repeats the readout m times to generate the fundamental tone signal having the predetermined frequency, "m" denoting a natural number, and the harmonic tone generator extracts the fundamental tone signal for every p samples and repeats the extraction p times to generate the harmonic tone signals having frequencies that are p times higher than the predetermined frequency, "p" denoting an integer larger than or equal to two.

3. The test-tone-signal generating circuit according to claim 2, wherein each predetermined interval has a length equal to two cycles of the sinusoidal signal stored in the memory.

4. A method of generating a test tone signal, the method comprising:

generating a fundamental tone signal, which is a sinusoidal signal having a predetermined frequency;

generating a first group of harmonic tone signals having different frequencies that are integral multiples of the predetermined frequency;

generating a second group of the harmonic tone signals having different frequencies that are integral multiples of the predetermined frequency, at least part of the second group of the harmonic tone signals having frequencies different from frequencies of the first group of the harmonic tone signals;

adding the fundamental tone signal to the first group of the harmonic tone signals to generate a first test tone signal;

adding the fundamental tone signal to the second group of the harmonic tone signals to generate a second test tone signal; and outputting the first and second test tone signals at predetermined intervals.

5. The method of generating a test tone signal according to claim 4, wherein the fundamental tone signal is generated by extracting digital data corresponding to one cycle of the sinusoidal signal for every m samples and repeating the extraction m times, "m" denoting a natural number, and each of the harmonic tone signals is generated by extracting the fundamental tone signal for every p samples and repeating the extraction p times, "p" denoting an integer larger than or equal to two.

* * * * *